United States Patent
Tanaka

(10) Patent No.: US 7,002,208 B2
(45) Date of Patent: Feb. 21, 2006

(54) SEMICONDUCTOR DEVICE AND MANUFACTURING METHOD OF THE SAME

(75) Inventor: Hiroyuki Tanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/895,301

(22) Filed: Jul. 2, 2001

(65) Prior Publication Data

US 2003/0003620 A1 Jan. 2, 2003

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/336; 257/335; 257/344; 257/346; 257/371; 257/408

(58) Field of Classification Search ............... 257/336, 257/344, 346, 366, 387, 384, 388, 335, 377, 257/383, 369, 371
See application file for complete search history.

(56) References Cited

U.S. PATENT DOCUMENTS

| | | | | | |
|---|---|---|---|---|---|
| 4,835,112 | A | * | 5/1989 | Pfiester et al. ................ 437/24 |
| 5,518,945 | A | * | 5/1996 | Bracchitta et al. ............ 437/34 |
| 5,646,435 | A | * | 7/1997 | Hsu et al. .................... 257/382 |
| 5,734,185 | A | * | 3/1998 | Iguchi et al. ................ 257/336 |
| 5,804,856 | A | * | 9/1998 | Ju .............................. 257/344 |
| 5,903,029 | A | * | 5/1999 | Hayashida et al. .......... 257/344 |
| 6,025,634 | A | * | 2/2000 | Teong ......................... 257/383 |
| 6,064,096 | A | * | 5/2000 | Son ............................. 257/368 |
| 6,107,129 | A | * | 8/2000 | Gardner et al. ............. 438/238 |
| 6,137,137 | A | * | 10/2000 | Wu ............................. 257/336 |
| 6,157,068 | A | * | 12/2000 | Hashimoto et al. ......... 257/384 |
| 6,210,999 | B1 | * | 4/2001 | Gardner et al. ............. 438/183 |
| 6,258,680 | B1 | * | 7/2001 | Fulford et al. .............. 438/305 |
| 6,268,286 | B1 | * | 7/2001 | Gauthier, Jr. et al. ....... 438/655 |
| 6,281,086 | B1 | * | 8/2001 | Wieczorek et al. ......... 438/305 |
| 6,316,323 | B1 | * | 11/2001 | Fang et al. .................. 438/305 |
| 6,337,504 | B1 | * | 1/2002 | Isobe et al. ................. 257/384 |
| 6,346,732 | B1 | * | 2/2002 | Mizushima et al. ........ 257/382 |
| 6,352,899 | B1 | * | 3/2002 | Sakiyama et al. .......... 438/300 |
| 6,399,451 | B1 | * | 6/2002 | Lim et al. ................... 438/303 |
| 6,432,785 | B1 | * | 8/2002 | Wu ............................. 438/305 |
| 6,433,371 | B1 | * | 8/2002 | Scholer et al. ............. 257/288 |
| 6,479,346 | B1 | * | 11/2002 | Yi et al. ...................... 438/257 |
| 6,638,829 | B1 | * | 10/2003 | Cheek et al. ............... 438/300 |

FOREIGN PATENT DOCUMENTS

| | | |
|---|---|---|
| JP | 5-315355 | 11/1993 |
| JP | 6-29530 | 2/1994 |
| JP | 9-153612 | 6/1997 |
| JP | 10-70270 | 3/1998 |

* cited by examiner

*Primary Examiner*—Tom Thomas
*Assistant Examiner*—Jesse A. Fenty

(57) ABSTRACT

A semiconductor device and a method for manufacturing the semiconductor device capable of reducing a short channel effect are provided.

The semiconductor device is made up of a pair of impurity regions for a source and a drain formed on a semiconductor substrate, a gate having a gate electrode used to control a drain current and side walls formed on both sides of the gate electrode and a pair of electrode members formed on both sides of the semiconductor substrate and in a manner to be in contact with the side walls. As impurity regions, there are provided first impurity regions formed by thermal diffusion of impurities from each of the electrode members and second impurity regions each having a thickness being smaller than that of the first impurity region and extending below the gate electrode, which are formed by thermal diffusion of impurities from the side walls.

16 Claims, 3 Drawing Sheets

SEMICONDUCTOR DEVICE AND MANUFACTURING METHOD OF THE SAME

BACKGROUND OF THE INVENTION

1. Field of the Invention

The present invention relates to a semiconductor device and a method for manufacturing the same which are capable of reducing a short channel effect which causes a decrease in a threshold voltage in the semiconductor such as an FET (Field Effect Transistor).

2. Description of the Related Art

When a semiconductor device such as a MOS (Metal Oxide Semiconductor) transistor is scaled down, a so-called scaling law is used as an index. However, it is impossible to lower a supply voltage to meet the scaling law due to a need for considerations to be given to the supply of power to other semiconductor devices, which, as a result, causes impact ionization in which an electron and a hole are generated because of collision of a hot carrier having high energy caused by a high voltage within a channel region between a source and a drain with a lattice of the semiconductor device within a channel region. That is, this causes a so-called "hot carrier effect" in which a threshold voltage (Vth) is changed due to a fixed charge accumulated in a gate insulator of the MOS.

To solve this problem, a device having an LDD (Lightly Doped Drain) structure to reduce the generation of hot carriers is proposed. In such the device having the LDD structure, a region providing a low impurity concentration is formed which is placed in contact with each of a pair of impurity regions for a source and a drain and has the impurity concentration being lower than that in each of the pair of impurity regions and extends in a channel extending direction from each of the corresponding impurity regions. The region having the low impurity concentration limits an electric field existing in the vicinity of the drain and the generation of the hot carriers is reduced by the electric field limiting effect.

A method for forming a semiconductor device having such the LDD structure is disclosed in Japanese Patent Application Laid-open No. Hei 5-315355 in which the pair of the impurity regions to be used for the source and drain is formed by using a thermal diffusion method and each of the impurity regions having the low impurity concentration and extending from each of the impurity regions for the source and drain is formed by using ion implantation method. Moreover, a method is disclosed in Japanese Patent Application Laid-open No. Hei 5-153612 for forming both the pair of the impurity regions to be used for the source and drain and the low concentration impurity regions extending from each of the impurity regions to be used for the source and the drain, by using the ion concentration method.

In the conventional method, the extended impurity regions each extending from each of the pair of the impurity regions to be used for the source and the drain toward the channel direction are formed by using the ion implantation method.

Therefore, in the conventional technology, since the impurity region is formed by the ion implantation method, its impurity distribution shows that the impurity concentration is not lowered gradually from a surface of the device, but it becomes increased at a predetermined depth from the surface and exhibits its maximum level at the predetermined depth and then becomes decreased as the depth from the surface becomes larger.

The impurity distribution in the impurity region formed by the ion implantation in which the maximum impurity concentration is exhibited at the predetermined depth from the surface shows that the short channel effect produced at a position being lower than the surface is reduced as a result. As described above, the short channel effect causes the decrease in the threshold voltage and also causes a so-called punch-through phenomenon in which a voltage between the source and drain cannot be controlled by the gate voltage.

SUMMARY OF THE INVENTION

In view of the above, it is an object of the present invention to provide a semiconductor device and a method for manufacturing the same which are capable of reducing a short channel effect.

According to a first aspect of the present invention, there is provided a semiconductor device including:

a pair of impurity regions each being used for a source and for a drain and being formed at intervals on a semiconductor substrate;

a gate having a gate electrode formed on the semiconductor substrate used to control a drain current flowing between the impurity regions and side walls composed of insulating materials and formed on both sides of the gate electrode;

a pair of electrode members formed on both sides of the gate on the semiconductor substrate and in a manner so as to be in contact with the side walls; and wherein the pair of the impurity regions is made up of first impurity regions formed by thermal diffusion of an impurity from each of the electrode members and of second impurity regions each having a thickness being smaller than that of the first impurity region and extending below the gate electrode and which are formed by thermal diffusion of an impurity from the side walls.

In the foregoing, a preferable mode is one wherein the electrode member is composed of silicide which has undergone implantation of an impurity by an ion implantation method prior to the thermal diffusion of the impurity from the electrode member and wherein the side walls are composed of insulating materials which have undergone implantation of an impurity by the ion implantation method prior to the thermal diffusion of the impurity from the side walls.

Also, a preferable mode is one wherein an impurity concentration in the second impurity region is almost the same as that in the first impurity region.

Also, a preferable mode is one wherein an impurity concentration in said second impurity region is smaller than that in said first impurity region.

Also, a preferable mode is one wherein each of the side walls extends, with its height being gradually decreased, on the semiconductor substrate in a direction in which both the side walls are brought near to each other from side portions of both the electrodes facing each other and wherein the gate electrode is formed in a manner that its both sides are disposed on the side walls.

According to a second aspect of the present invention, there is provided a method for manufacturing a semiconductor device made up of a pair of impurity regions each being used for a source and for a drain and being formed at intervals on a semiconductor substrate, a gate having a gate electrode formed on the semiconductor substrate used to control a drain current flowing between the impurity regions and side walls composed of insulating materials and formed on both sides of the gate electrode and a pair of electrode members formed on both sides of the gate on the semiconductor substrate and in a manner so as to be in contact with the side walls, including:

a step of forming a first impurity region below each of the electrode member by thermal diffusion of an impurity from each of the electrode members on the semiconductor substrate; and a step of forming a second impurity region having a thickness being smaller than that of the first impurity region and extending from the first impurity region below the gate electrode by thermal diffusion of an impurity from the side walls on the semiconductor substrate and in a manner that the forming of the second impurity region proceeds in cooperation with a reaction in the first impurity region.

In the foregoing, a preferable mode is one wherein the thermal diffusion employed to form each of the first and second impurity regions is simultaneously executed by a RTA (Rapid Thermal Annealing) method.

Also, a preferable mode is one wherein the forming process of the first impurity regions includes a step of stacking a silicon layer to be used for the pair of the electrode members on the semiconductor substrate, a step of causing the silicon to become a silicide, a step of implanting the impurity to be diffused into the silicide and a step of performing heating processing on the semiconductor substrate to thermally diffuse the impurity to the semiconductor substrate from the pair of the electrode members obtained by performing patterning operations on the silicon layer with the impurity implanted.

Also, a preferable mode is one wherein the forming process of the second impurity regions includes a step of stacking an insulating material to be used for the pair of the side walls on the semiconductor substrate, a step of implanting the impurity to be diffused into a stacked layer composed of the insulating material and a step of performing heating processing on the semiconductor substrate to thermally diffuse the impurity to the semiconductor substrate from the pair of the side walls obtained by performing patterning operations on the stacked layer with the impurity implanted.

Also, a preferable mode is one wherein the silicon layer to be used for the electrode members is formed by a CVD (Chemical Vapor Deposition) method.

Also, a preferable mode is one wherein the process of causing the silicon layer to become the silicide includes a step of stacking a metal material on the silicon layer by a sputtering method and a step of performing thermal processing on the silicon layer to cause a metal layer composed of the metal material stacked on the silicon layer to react with the silicon layer.

Furthermore, a preferable mode is one that wherein includes:

a step of stacking the silicon layer to be used for the pair of the electrode members on the semiconductor substrate;

a step of causing the silicon to become a silicide;

a step of implanting the impurity to be diffused into the silicide obtained through the step of causing the silicon to become a silicide;

a step of performing etching processing on the silicide to form the pair of the electrode members by using the silicide into which the impurity is implanted;

a step of stacking insulating materials to be used for the pair of the side walls on the pair of the electrode members and on portions exposed between the electrode members on the semiconductor substrate;

a step of implanting the impurity to be diffused into the insulating layer formed by stacking of the insulating materials;

a step of removing unwanted portions of the insulating layer with the impurity implanted to form the pair of the side walls facing each other at intervals;

a step of forming a gate electrode formed between the side walls on the semiconductor substrate with a gate insulator interposed between the gate electrode and the semiconductor substrate in a manner that both sides of the gate electrode are disposed on both the side walls; and a step of thermally diffusing the impurity simultaneously from each of the pair of the electrode members with the impurity implanted and from each of the pair of the side walls with the impurity implanted.

According to a third aspect of the present invention, there is provided a method for manufacturing a semiconductor device made up of a pair of impurity regions each being used for a source and for a drain and being formed at intervals on a semiconductor substrate, a gate having a gate electrode formed on the semiconductor substrate used to control a drain current flowing between the impurity regions and side walls composed of insulating materials and formed on both sides of the gate electrode and a pair of electrode members formed on both sides of the gate on the semiconductor substrate and in a manner so as to be in contact with the side walls, including:

a step of forming a first impurity region below each of the electrode member by thermal diffusion of an impurity from each of the electrode members on the semiconductor substrate; and a step of forming a second impurity region having a thickness being smaller than that of the first impurity region and extending from the first impurity region below the gate electrode by thermal diffusion of an impurity from the side walls on the semiconductor substrate and in a manner that the forming of the second impurity region proceeds in cooperation with a reaction in the first impurity region, wherein the thermal diffusion employed to form each of the first and second impurity regions is simultaneously executed.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Best modes of carrying out the present invention will be described in further detail using various embodiments with reference to the accompanying drawings.

First Embodiment

Figure 1A:
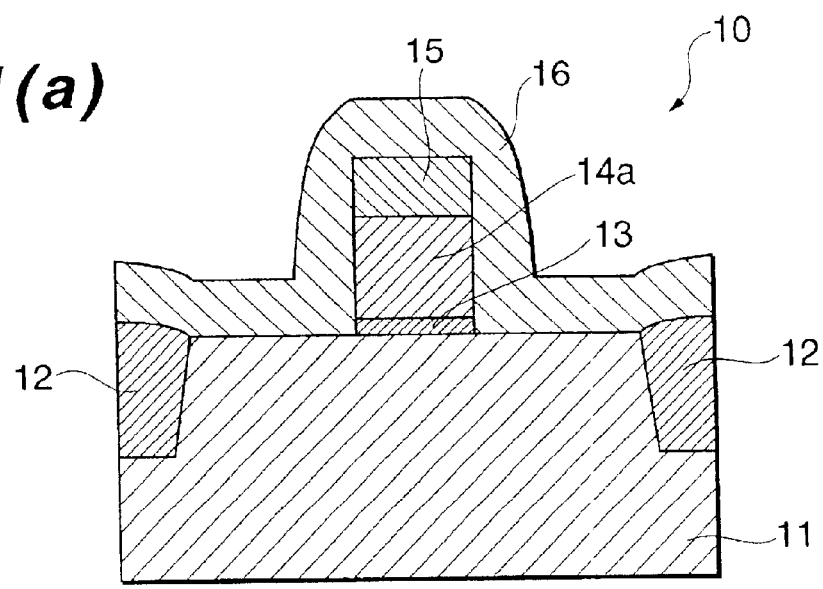
FIGS. 1(a), (b) and (c) and FIGS. 2(a), (b) and (c) are diagrams showing processes of manufacturing a semiconductor device 10 according to a first embodiment of the present invention.
Figure 2A:
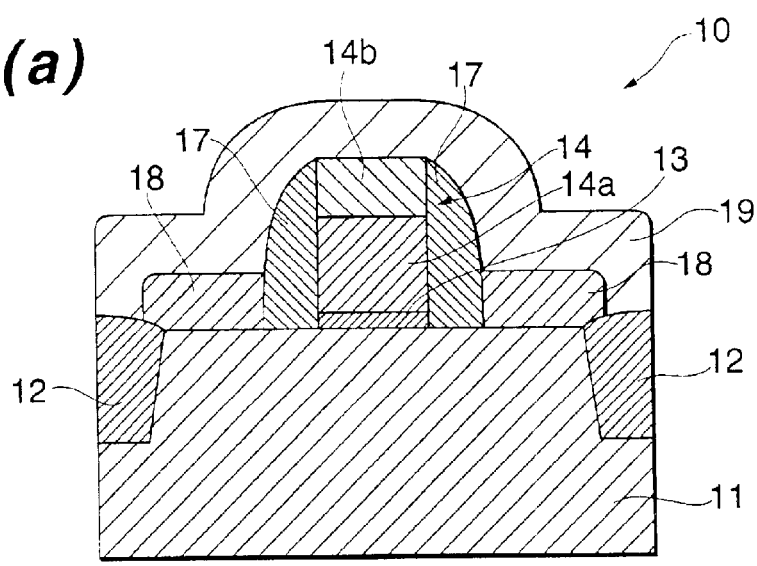
Figure 2B:
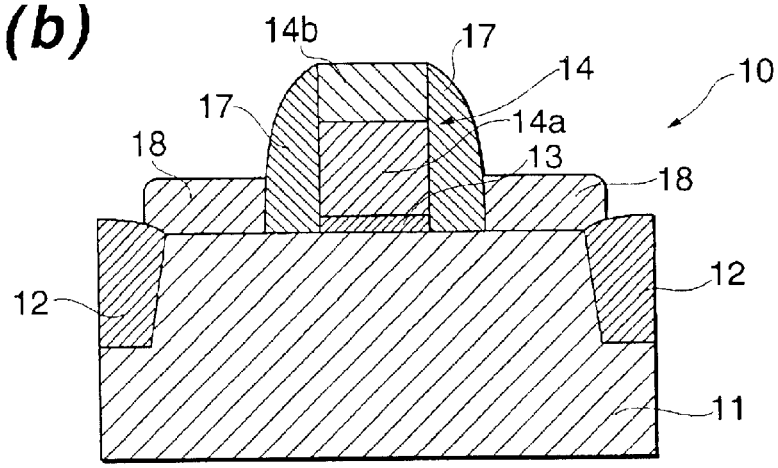
Figure 2C:
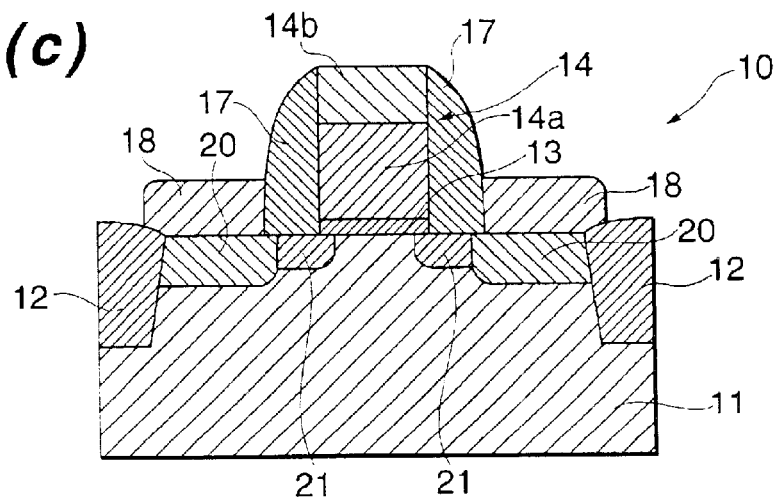

FIGS. 1(a), (b) and (c) and FIGS. 2(a), (b) and (c) are diagrams showing processes of manufacturing a semiconductor device 10 according to a first embodiment of the present invention. In FIGS. 1(a), (b) and (c) and FIGS. 2(a), (b) and (c) is shown a process of manufacturing an n-channel MOS FET using, for example, a p-type substrate.

As shown in FIG. 1(a), on a silicon semiconductor substrate exhibiting a p-type characteristic, as is well known, is formed a device separating region 12 to partition an active region for a semiconductor device. The device separating region 12 is formed by an STI (Shallow Trench Isolation) method.

On the active region partitioned by the device separating region 12 is formed a gate electrode 14 used for the MOS FET. The gate electrode 14 includes a gate electrode member 14a formed on the active region with a gate insulator 13 interposed therebetween. To form the gate electrode 14, as is well known, on the active region are sequentially stacked an insulating film (not shown) for the gate insulator 13 and a conductive polycrystalline silicon layer (not shown) for the gate electrode member 14a. Patterning is performed by photolithographic etching technology using an etching mask composed of, for example, a silicon nitride film formed on the conductive polycrystalline silicon layer. This causes the gate electrode material 14a to be formed and the etching mask 15 to reside on the gate electrode member 14a.

After the gate electrode member 14a has been formed, a silicon dioxide layer 16 to be used as side walls (described later) is formed, for example, by a CVD (Chemical Vapor Deposition) method in a manner so as to cover the etching mask 15 on the gate electrode member 14a and side portions of the gate electrode member 14a.

Then, in order to introduce the impurity into the silicon dioxide layer 16, n-type impurity is implanted by the ion implantation. It is preferable that the ion implantation is performed from a slanting direction so that the impurity is efficiently implanted in portions positioned on both sides of the gate electrode 14a in the silicon dioxide layer 16, that is, in the side walls 17.

Figure 1B:
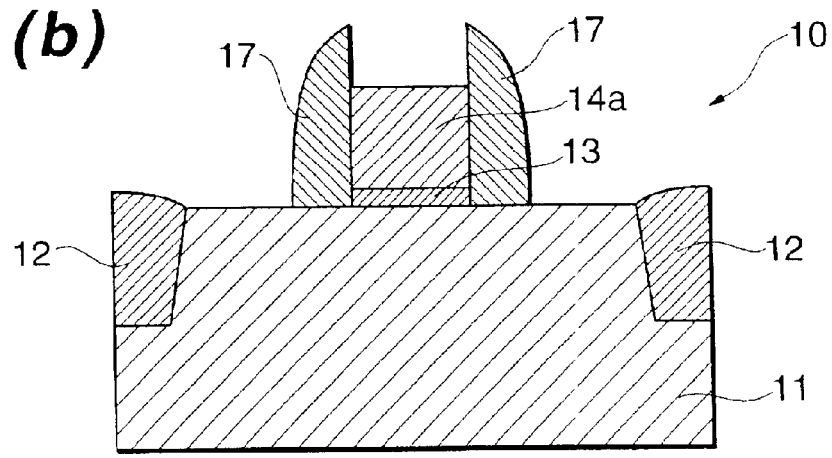

As shown in FIG. 1(b), to remove unwanted portions except those positioned on both sides of the gate electrode member 14a in the silicon dioxide layer 16 containing the n-type impurity, for example, anisotropic etching processing is performed on the silicon dioxide layer 16. After the side walls 17 between which the gate electrode member 14a is interposed have been formed by using the anisotropic etching processing, the etching mask 15 formed using the silicon nitride film is removed by a selective etching method.

Figure 1C:
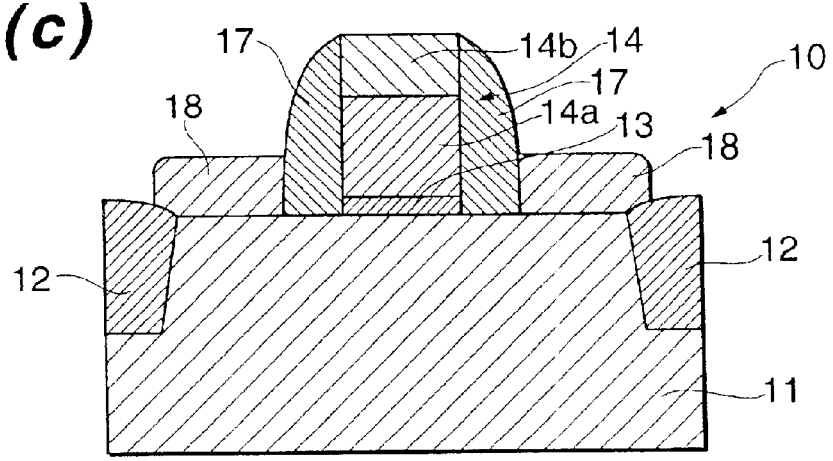

Then, as shown in FIG. 1(c), an upper electrode member 14b is formed on the gate electrode member 14a and a pair of the source/drain electrode members 18 used for the source/drain is formed on the outsides of both the side walls 17 on the active region. To allow the upper electrode member 14b and the pair of the source/drain electrode members 18 to be formed, a silicon layer (not shown) with a thickness of 50 nm is stacked and then etching processing is selectively performed on the silicon layer to remove unwanted portions, thus causing each of portions of the upper electrode member 14b and the pair of the source/drain electrode members 18 to be formed.

Then, as shown in FIG. 2(a), a cobalt layer 19 is formed in a manner that it covers the device separating region 12, the side walls 17, the upper electrode member 14b and the pair of the source/drain electrode members 18. The cobalt layer 19 is stacked so as to have a thickness of 50 nm, for example, by using a sputtering method, as is well known.

After the cobalt layer 19 has been formed, heating processing is performed on the upper electrode member 14b and the pair of electrode members 18 so that they become a silicide containing the cobalt. To cause them to become the silicide containing the cobalt, the cobalt layer 19 is heated up to, for example, about 550° C., by a RTA methed, as pre-treatment. By this pre-treatment, the cobalt is diffused from the cobalt layer 19 to each of portions constituting the upper electrode member 14b and the pair of the source/drain electrode members 18 contacting the cobalt layer 19 and silicon contained in the upper electrode member 14b and the pair of the source/drain electrode members 18 changes to be cobalt monosilicide (CoSi). After the heating processing as the pre-treatment has been performed, an-reacted portion contained in the cobalt layer 19 is removed by chemicals and then heating processing at a temperature of about 800° C. is performed by a RTA (Rapid Thermal Annealing) method. By the RTA method, each of the silicon components constituting the upper electrode member 14b and the pair of the source/drain electrode members 18 is further changed to be cobalt disilicide ($CoSi_2$). By changing the silicon component to the silicide, as is conventionally known, the upper electrode member 14b and the pair of the source/drain electrode members 18 each having a low resistance are formed. The upper electrode member 14b whose silicon component have been changed to be the silicide and the gate electrode member 14a placed below the upper electrode member 14b provide a conventionally well-known multi-layered gate electrode 14. The pair of the source/drain electrode members 18 whose silicon component has been changed to be the silicide is enabled to be in a good ohmic contact with a conductive line drawn from the source/drain electrode members 18.

Into regions below the pair of the source/drain electrode members 18 is implanted an n-type impurity such as phosphorous to form impurity regions to be used for the source and the drain. On the other hand, as described by referring to FIG. 1(a), into the side walls between which the gate electrode 14 made up of the gate electrode member 14a and the upper electrode member 14b is disposed is implanted the n-type impurity while the side walls are being formed. The impurity concentration set at the time of the ion implantation into the pair of the source/drain electrode members 18 is higher than that set at the time of the ion implantation into the side walls 17.

By performing heating processing, at a temperature of about 850° C. for ten seconds, on the entire silicon semiconductor substrate 11, for example, by the RTA method, after the ion implantation of the n-type impurity into the pair of the source/drain electrode members 18, the impurity is diffused from the pair of the source/drain electrode members 18 to the silicon semiconductor substrate 11 and the impurity is diffused from both the side walls 17 to the silicon semiconductor substrate 11.

By the diffusion from the pair of the source/drain electrode members 18, a pair of first impurity regions 20 is formed in the silicon semiconductor substrate 11 below the pair of the source/drain electrode members 18 used for the source and the drain.

Moreover, by the diffusion from both the side walls 17, a pair of second impurity regions 21 each extending from an edge portion being in contact with each of the pair of the first impurity regions 20 toward regions below the gate electrode 14 is formed in the silicon semiconductor substrate 11 below both the side walls 17. A depth of each of the second impurity regions 21, since the impurity concentration set at the time of the ion implantation into the side walls 17 is lower that that set at the time of the ion implantation into the pair of the source/drain electrode members 18, as described above, is smaller than that of each of the first impurity regions 20.

Moreover, an impurity concentration in the second impurity regions 21 is comparatively smaller than that in the first impurity regions 20. The semiconductor device having such the configurations as described above is called a device having the LDD structure in which the generation of the hot carriers can be effectively prevented by an field limiting effect.

In the semiconductor device 10 of the first embodiment of the present invention, each of the second impurity regions 21 being an extending impurity region which extends in a direction in which both the second impurity regions 21 are brought near to each other from each of the pair of the first impurity regions 20 is formed by thermal diffusion of the impurity from the side walls 17. The impurity concentration in the impurity region formed by such the thermal diffusion as described above is highest in the vicinity of the surface of the silicon semiconductor substrate 11 and becomes lower as the depth from the surface becomes larger.

In such the impurity concentration distribution, in the case of the conventional extending impurity region formed by the ion implantation, as described above, since the maximum impurity concentration is exhibited at the predetermined depth from the surface of the substrate, the short channel effect is accelerated.

Unlike in the case of the conventional semiconductor device, since the distribution of the impurity concentration in the extending impurity region 21 of the present invention shows that the impurity concentration becomes lower as the depth from the surface of the silicon semiconductor substrate 11 becomes larger, the short channel effect can be more efficiently reduced compared with the case of the conventional impurity regions, thus preventing the decrease in the threshold voltage caused by the short channel effect and avoiding the occurrence of the punch-through phenomenon.

In the above description, the example in which the impurity concentration of the extending impurity region 21 is lower than that in the source/drain regions 20 is explained, however, the impurity concentration in the extending impurity region 21 is made equal almost to that in the source/drain regions 20. For example, if a peak impurity concentration in the source/drain regions 20 provided in the impurity distribution is $10^{20}$ pieces/cm$^3$, the peak impurity concentration in the extending impurity region 21 is $10^{19}$ pieces/cm$^3$~$10^{20}$ pieces/cm$^3$.

Second Embodiment

In the process of manufacturing a semiconductor device 10 of a second embodiment of the present invention, as shown in FIG. 3(a) to FIG. 3(d), after a pair of the source/drain electrode members 18 has been formed, a gate electrode 14 is formed.

Figure 3A:
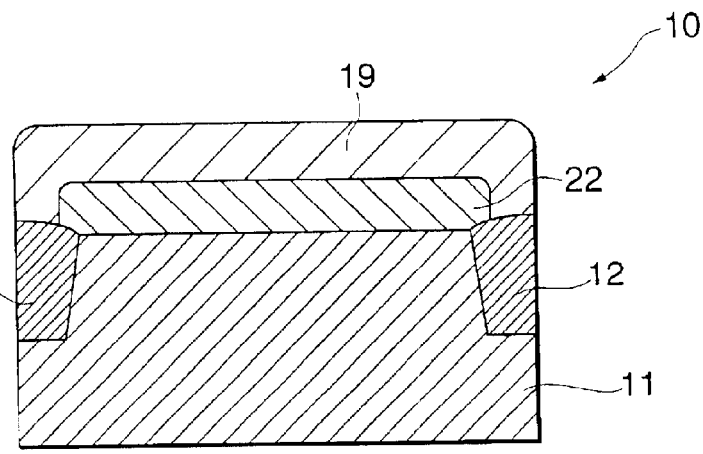
FIG. 3 is diagrams showing processes of manufacturing a semiconductor device 10 according to a second embodiment of the present invention.

As shown in FIG. 3(a), on a silicon semiconductor substrate 11 exhibiting a p-type characteristic is formed a device separating region 12 having the same structure as in the first embodiment. A silicon layer 22 with a thickness of 50 nm to be used as electrodes to be used for a source and a drain is formed on the active region partitioned by the device separating region 12. Then, a cobalt layer 19 is formed in a manner that it covers the device separating region 12 and the silicon layer 22. The cobalt layer 19 is formed by the well-known sputtering method so as to have the thickness of 50 nm. Moreover, to introduce an impurity into the cobalt layer, the n-type impurity such as phosphorous is implanted by the ion implantation method.

Figure 3B:
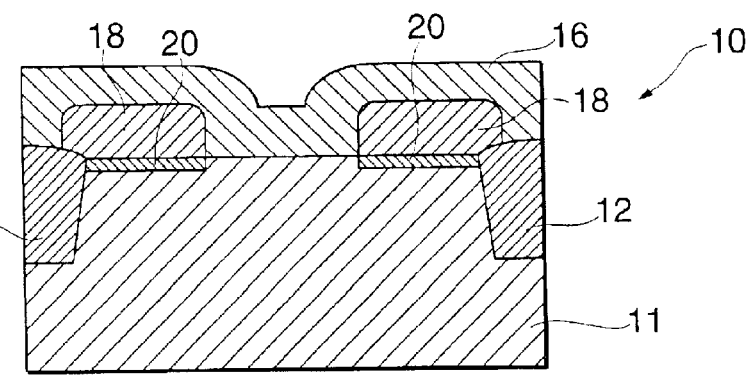

Then, as shown in FIG. 3(b), to form electrode members to be used for the source and drain, etching processing is performed on the silicon layer 22 and the cobalt layer 19 existing on the silicon layer 22 to remove their unwanted portions. Heating processing is performed so as to react the silicon residing by the etching processing with cobalt residing on the silicon and to form a source/drain electrode members 18. The heating processing is performed by combining the same pre-treatment heating as described above with heating treatment by the RTA method and before the RTA heating process is carried out, unwanted cobalt existing on the silicon portions is removed. The heating processing causes the silicon layer 22 to react with the remaining portion of the cobalt layer 19, thereby changing the remaining portion of the silicon layer 22 to be a silicide which acts as the source/drain electrode members 18. Moreover, the RTA heating processing causes a part of the impurity incorporated into the source/drain electrode members 18 out of the impurity implanted into the cobalt layer 19 to be thermally diffused to the silicon semiconductor substrate and the thermal diffusion causes a pair of first impurity region 20 to be used for the source and drain to be formed below the source and drain electrode members 18.

A silicon dioxide layer 16 to be used as side walls to insulate the source/drain electrode members 18 and the gate electrode 14 to be formed later is then formed by the CVD method in a manner that it covers the source/drain electrode members 18 existing on the active region and the active region on which no source/drain electrode electrodes 18 are formed. Moreover, in order to introduce the impurity into the silicon dioxide layer 16, the n-type impurity such as phosphorous is implanted by the ion implantation. As in the case of the first embodiment, the impurity concentration at the time of the ion implantation into the silicon dioxide to be used as the side walls is set to be lower than that at the time of the ion implantation into the pair of the source/drain electrode members 18. To efficiently implant the impurity into the portion to be used as the side walls, it is preferable to perform the ion implantation from a slanting direction.

Figure 3C:
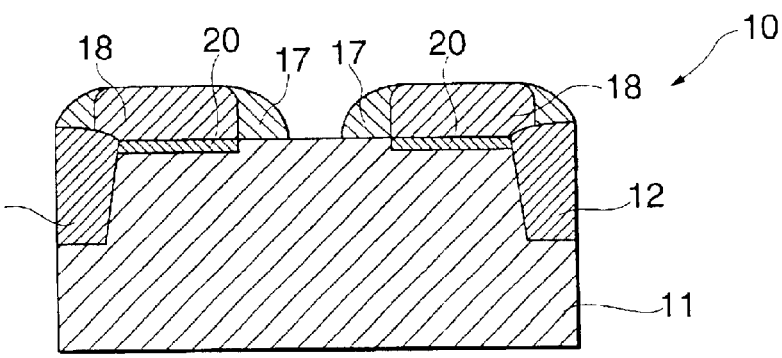

Then, as shown in FIG. 3(c), side walls 17 having shapes being different from the side walls in the first embodiment are formed in a manner that each of the side walls extends toward a direction in which the source/drain electrode members 18 are brought near to each other from side portions of the source/drain electrode members 18 facing each other and also in a manner that heights of the side walls gradually decrease. These side walls can be formed by performing the anisotropic etching on the silicon dioxide layer 16 containing the n-type impurity.

Figure 3D:
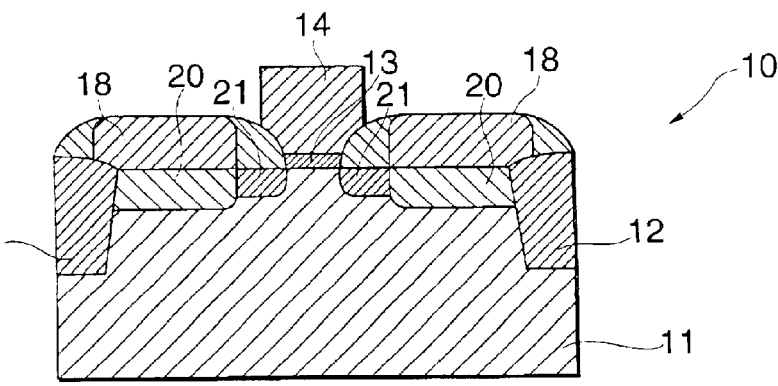

As shown in FIG. 3(d), the gate electrode 14 for the MOS FET is formed on the active region disposed between both the side walls 17. Between the gate electrode 14 and the active region is formed the gate insulator 13, as is well known. That is, when the gate electrode 14 is formed, as is well known, an insulating layer (not shown) to be used for the gate insulator 13 and, for example, a conductive polycrystalline silicon layer (not shown) to be used for the gate electrode 14 are sequentially stacked. Then, patterning operation is performed on the stacked layer by the photolithographic etching technology using, for example, an etching mask (not shown) on the conductive polycrystalline silicon layer. Thus, the gate electrode 14 is formed.

Then, by performing thermal treatment on the entire silicon semiconductor substrate 11 using, for example, the RTA method, at a temperature of about 850° C. for 10 seconds, the impurity is diffused from both the side walls 17 to the silicon semiconductor substrates 11 and second impurity regions 21 is formed which extend from edge portions of the first impurity regions coming near each other toward the gate electrode 14. Moreover, by the RTA heating treatment at the high temperature, the impurity is diffused from the pair of the source/drain electrode members 18 to the silicon semiconductor substrate 11, which causes the impurity concentration in the pair of the first impurity regions 20 to reach a proper concentration.

A depth of each of the second impurity regions 21, since the impurity concentration set at the time of the ion implantation into the side walls 17 is lower that set at the time of the ion implantation into the pair of the source/drain electrode members 18, as described above, is smaller than that of each of the first impurity regions 20.

Moreover, in the structure of the LDD having the second impurity region 21 in which the impurity concentration is lower than that in the first impurity region 20, the generation of the hot carriers can be efficiently prevented by the electric field limiting effect.

In the semiconductor device 10 of the second embodiment, as in the case of the first embodiment, the second impurity region 21 being the extending impurity region is formed by thermal diffusion of the impurity from the side walls 17.

Since the impurity concentration in the second impurity region 21 is highest in the vicinity of the surface of the silicon semiconductor substrate 11 and becomes lower as the depth from the surface becomes larger, the short channel effect occurring at a position being deeper than the surface of the semiconductor substrate 11 can be efficiently reduced and the decrease in the threshold voltage caused by the short channel effect and the generation of the punch-through phenomenon can be prevented.

As described above, according to the semiconductor device of the present invention, since the second impurity region extending from the first impurity region is formed by thermal diffusion from the side walls, the impurity concentration in the second impurity region gradually lowers as the depth from the surface of the semiconductor substrate becomes deeper, which can reduce the short channel effect causing the decrease in the threshold of the gate voltage controlling carriers between channels.

Moreover, according to the semiconductor device of the present invention, by adjusting the impurity concentration in the second impurity region, that is, by setting so that the impurity concentration in the second impurity region is almost equal to that in the first impurity region, the short channel effect can be effectively reduced and, at the same time, sufficient drain currents can be obtained.

Furthermore, according to the method of manufacturing the semiconductor device of the present invention, such the semiconductor devices as described above can be manufactured comparatively easily.

It is thus apparent that the present invention is not limited to the above embodiments but may be changed and modified without departing from the scope and spirit of the invention. For example, in the above description, the present invention is applied to the n-type MOS transistor, however, the present invention can be applied to a p-type MOS transistor and a gate device of transistors other than the MOS transistor.

What is claimed is:

1. A MOS transistor, comprising:
a semiconductor substrate having a top surface;
isolation regions formed in said substrate;
a gate structure formed over said substrate having sidewalls disposed on both sides of said gate structure;
a source region having a source lightly doped region and a source heavily doped region, wherein an impurity concentration of said source lightly doped region is lower than an impurity concentration of said source heavily doped region, each of which having an upper portion in contact with the side wall, wherein the source lightly doped region is formed below one of said sidewalls and said impurity concentration decreases as a depth from the top surface of the substrate increases, said source heavily doped region being disposed between said source lightly doped region and said isolation region, and wherein a portion of said source lightly doped region extends beneath a gate oxide of said gate structure;
a drain region having a drain lightly doped region and a drain heavily doped region, wherein an impurity concentration of said drain lightly doped region is lower than an impurity concentration of said drain heavily doped region, wherein the drain lightly doped region is formed below one of said sidewalls, wherein said drain heavily doped region is disposed between said drain lightly doped region and said isolation region and wherein a portion of said drain lightly doped region extends beneath a gate oxide of said gate structure; and
metallic silicide layers respectively formed on said source heavily doped regions and said drain heavily doped regions, said metallic silicide layers being in contact with said sidewalls and said isolation regions, and extending onto said isolation regions, wherein undersides of said metallic silicide layers are substantially coplanar with respective undersides of said sidewalls in contact with said top surface.

2. A MOS transistor as recited in claim 1, wherein said metal silicide layers are formed between each of said sidewalls and said isolation regions.

3. The MOS transistor according to claim 2, wherein said metal silicide layers have undergone implantation of an impurity by an ion implantation method prior to said thermal diffusion of said impurity and wherein said side walls are composed of insulating materials which has undergone implantation of an impurity by said ion implantation method prior to said thermal diffusion of said impurity from said side walls.

4. The MOS transistor according to claim 1, wherein an impurity concentration in said source lightly doped region is almost the same as that in said source heavily doped region.

5. The MOS transistor according to claim 1, wherein an impurity concentration in said source lightly doped region is substantially smaller than that in said source heavily doped region.

6. The MOS transistor according to claim 1, wherein an impurity concentration in said drain lightly doped region is almost the same as that in said drain heavily doped region.

7. The MOS transistor according to claim 1, wherein an impurity concentration in said drain lightly doped region is substantially smaller than that in said drain heavily doped region.

8. The MOS transistor according to claim 1, wherein each of said side walls extends on said semiconductor substrate in a direction in which both said side walls are brought near to each other from side portions of both said electrodes facing each other and wherein a gate electrode is formed in a manner that its both sides are disposed on said side walls.

9. A semiconductor device, comprising:
a semiconductor substrate having a top surface;
isolation regions formed in said substrate, and which define active regions;
MOS transistors respectively disposed in said active regions, each of said MOS transistors having a gate structure, a source region, a drain region and sidewalls disposed on either side of each of said gate structures;

wherein each of said source regions has a source lightly doped region and a source heavily doped region, each of which having an upper portion in contact with the side wall, wherein an impurity concentration of said source lightly doped region is lower than an impurity concentration of said source heavily doped region sidewalls and said impurity concentration decreases as a depth from the top surface of the substrate increases, wherein the source lightly doped region is formed below one of said sidewalls, and wherein said source heavily doped region is disposed between said source lightly doped region and one of said isolation regions;

wherein each of said drain regions has a drain lightly doped region and a drain heavily doped region, wherein an impurity concentration of said drain lightly doped region is lower than an impurity concentration of said drain heavily doped region, wherein the drain lightly doped region is formed below another of said sidewalls, and wherein said drain heavily doped region is disposed between said drain lightly doped region and said isolation region; and metallic silicide layers respectively formed on said source heavily doped regions and said drain heavily doped regions, said metallic silicide layers being in contact with said sidewalls and said isolation regions, wherein undersides of said metallic silicide layers are substantially coplanar with respective undersides of said sidewalls in contact with said top surface.

10. A semiconductor device as recited in claim 9, wherein said metal silicide layers are formed between each of said sidewalls and said isolation regions.

11. The semiconductor device according to claim 9, wherein said metal silicide layers have undergone implantation of an impurity by an ion implantation method prior to said thermal diffusion of said impurity and wherein said side walls are composed of insulating materials which has undergone implantation of an impurity by said ion implantation method prior to said thermal diffusion of said impurity from said side walls.

12. The semiconductor device according to claim 9, wherein an impurity concentration in said source lightly doped regions is almost the same as that in said source heavily doped regions.

13. The semiconductor device according to claim 9, wherein an impurity concentration in said source lightly doped regions is substantially smaller than that in said source heavily doped regions.

14. The semiconductor device according to claim 9, wherein an impurity concentration in said drain lightly doped regions is almost the same as that in said drain heavily doped regions.

15. The semiconductor device according to claim 9, wherein an impurity concentration in said drain lightly doped regions is substantially smaller than that in said drain heavily doped regions.

16. The semiconductor device according to claim 9, wherein each of said side walls extends on said semiconductor substrate in a direction in which both said side walls are brought near to each other from side portions of both said electrodes facing each other and wherein a gate electrode is formed in a manner that its both sides are disposed on said side walls.

* * * * *